United States Patent [19]

Kleinknecht et al.

[11] 4,211,489
[45] Jul. 8, 1980

[54] PHOTOMASK ALIGNMENT SYSTEM

[75] Inventors: Hans P. Kleinknecht, Bergdietikon, Switzerland; Wolfram A. Bösenberg, Monmouth Junction, N.J.

[73] Assignee: RCA Corporation, New York, N.Y.

[21] Appl. No.: 869,637

[22] Filed: Jan. 16, 1978

[51] Int. Cl.$^2$ .................... G01B 11/26; G01B 9/02
[52] U.S. Cl. .................... 356/400; 250/237 G; 356/356
[58] Field of Search .......... 356/363, 373–374, 356/395, 400, 73, 357–358, 354–356, 152; 250/237 G, 548, 550

[56] References Cited

U.S. PATENT DOCUMENTS

| | | | |
|---|---|---|---|
| 3,756,723 | 9/1973 | Hock | 356/354 |
| 3,930,733 | 1/1976 | Holly | 356/363 |
| 4,103,998 | 8/1978 | Nakazawa et al. | 356/395 |
| 4,105,339 | 8/1978 | Wirtanen | 356/152 |

OTHER PUBLICATIONS

Flanders et al., "A New Interferometric Alignment Technique", App. Physics Letters, vol. 31, 10-1-77, pp. 426–428.

Post, D., "Moire Fringe Multiplication with a Nonsymmetrical Doubly Blazed Reference Grating", App. Optics, vol. 10, 4-1971, pp. 901–907.

Primary Examiner—John K. Corbin
Assistant Examiner—Wm. H. Punter
Attorney, Agent, or Firm—Birgit E. Morris; D. S. Cohen; Sanford J. Asman

[57] ABSTRACT

An automatic photomask alignment system includes a monochromatic light source, such as a laser, a series of diffraction patterns which are located on a semiconductor substrate and keys which are located on photomasks with which the substrate is to be aligned. A light beam is directed through the key on a photomask onto the diffraction pattern to provide a pattern of light spots whose intensities at various locations are determined by the relative alignment of the mask and the diffraction grating. A feedback arrangement which employs photocells and means for moving the photomasks relative to the substrate provides the alignment of the photomasks with the substrate.

23 Claims, 13 Drawing Figures

PHOTOMASK ALIGNMENT SYSTEM

The present invention relates to a photomask alignment system of the type used in the manufacture of semiconductor devices.

In the manufacture of semiconductor devices, particularly integrated circuits, a number of photomask steps are used for defining areas on semiconductor substrates. In each photomask step, a photomask must be aligned with a semiconductor substrate in order to define the desired areas in the correct location. Usually, photomask alignment is conducted visually using keys which are located on the substrate and on the photomask which are matched manually by an operator using a microscope. In such methods of photomask alignment, the photomasks and substrates with which they are aligned are in intimate contact in order to have both items simultaneously within the field of view of the microscope and to eliminate alignment errors due to parallax. The intimate contact between the photomask and the surface of the substrate damages the photomask and limits the number of times which it may be used before it is discarded.

In order to eliminate the problems associated with the contact alignments and to speed up and make more accurate the aligning process, a contactless alignment device capable of automatic, accurate alignment of a photomask and a substrate would be desirable.

Figure 1:
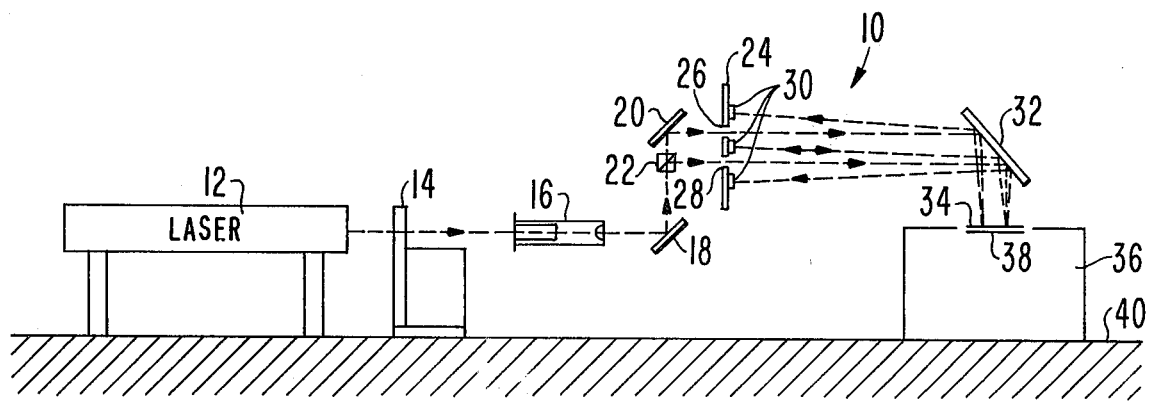
FIG. 1 illustrates a side view of the photomask alignment system of the present invention.

Referring now to FIG. 1, the photomask alignment system 10 of the present invention is shown. The photomask alignment system 10 comprises a monochromatic light source, such as a laser 12, which may be a helium-neon laser such as Spectra Physics Model 120 having a power output of 5 mW and a wavelength 0.6328 microns. That wavelength is particularly suitable, because photoresists presently used in semiconductor manufacturing processes are not sensitive to that wavelength, so the photoresist is not exposed during the alignment process. The system 10 includes a light chopper 14, such as Princeton Applied Research Model 125A which has a 48 aperture wheel providing a chopping rate of about 1600 Hz. A beam collimator 16 is used to produce a light spot having a diameter of approximately 1 millimeter. The system 10 further comprises a pair of mirrors 18, 20 which are separated by a prism type beam splitter 22, such as Edmund Scientific Model 40887. The mirrors 18, 20 used in the preferred embodiment of the invention have a diameter of about 5 cm. Adjacent to the mirror 20 and the beam splitter 22 there is a screen 24 having a pair of holes 26, 28 each of which has a diameter of about 5 millimeters. In the preferred embodiment of the invention, six photosensitive elements, such as photodiodes 30, (only 3 of which appear in the plane of the drawing of FIG. 1) are mounted on the surface of the screen 24 which is away from the mirror 20 and the beam splitter 22. The photodiodes 30 may be type DT40 manufactured by EG&G which are silicon PIN diodes having an active area of about 13 mm$^2$. The system 10 further comprises a surface mirror 32 which may be rectangular in shape having dimensions of approximately 5 cm by 15 cm. Beneath the mirror 32 is a photomask 34 which is mounted on a movable mounting means, such as stage 36 which provides x, y and rotational movement of the photomask 34 with respect to a semiconductor substrate 38 mounted under the photomask 34 and which is part of a feedback mechanism which uses the diodes 30 to provide an error signal, as will be explained hereinafter. The error signals from the diodes drive servo motors which move the photomask 34 relative to the substrate 38 to reduce the error signal, as will be obvious to those of ordinary skill in the art. All of the apparatus described above is mounted on a firm support such as an optical table 40, which is used to isolate the apparatus from vibrations which effect the alignment procedures.

Figure 2:
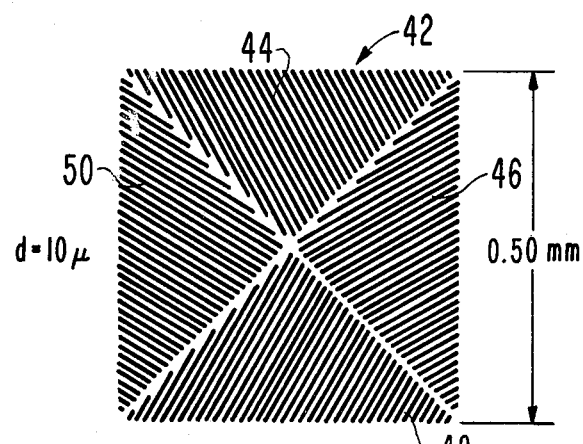
FIG. 2 is a top view of a diffraction pattern of the type employed with the present invention.

FIG. 2 illustrates the preferred embodiment of a diffraction pattern 42 which is used in conjunction with the present invention. The particular pattern 42 employed is not critical to the invention. However, a pattern 42 which provides x and y information in the form of diffraction gratings must be used, and the pattern 42 illustrated in FIG. 2 has been found to be acceptable for that purpose. The pattern 42 comprises a square having an edge dimension of about 0.50 mm which is divided into four sections 44, 46, 48 50 by the diagonals of the square. Each of the sections 44, 46, 48, 50 comprises a diffraction grating whose lines are oriented at a particular angle chosen so that both x-axis and y-axis information is available from the pattern 42. In the preferred embodiment of the diffraction pattern 42 the periodicity of each diffraction grating is 10 microns. The diffraction pattern 42 may be formed on a semiconductor substrate, such as the substrate 38 in a number of different ways. For example, the diffraction gratings may be made up of a defined photoresist in one step of the process of manufacturing semiconductor devices and may be made up of a defined oxide layer, a defined semiconductor layer, or a defined metal layer in other steps of the process. Accordingly, it is only important to the invention that the diffraction pattern 42 be present on or in the substrate to the extent that the desired diffraction pattern 42 will provide spots in the proper locations when the pattern 42 is illuminated by the laser 12. The specific makeup of the diffraction pattern 42, other than the layout of its gratings 44, 46, 48, 50 is unimportant.

Figure 3:
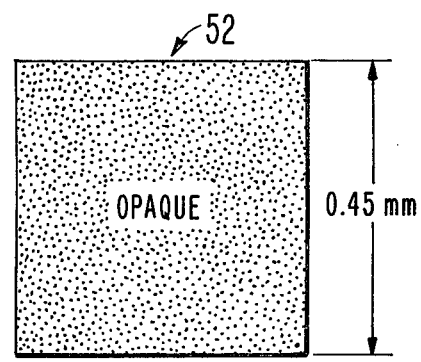
FIG. 3 is a top view of an opaque key which would be used on a photomask employed in conjunction with the diffraction pattern of FIG. 2.

A key 52, shown in FIG. 3, is part of the photomask 34, and in the preferred embodiment of the invention, the key 52 comprises an opaque square (shown stippled in FIG. 3) having an edge length of about 0.45 mm. The exact shape of either the diffraction pattern 42 or the key 52 is unimportant to the present invention as long as their shapes are compatible with one another as will be understood by one of ordinary skill in the art. By changing the size or shape of the key 52 relative to the size and shape of the pattern 42, the sensitivity of the system 10 is affected, and the relationship of the output voltage of the diodes 30 to the displacement of the key 52 with respect to the pattern 42 is determined.

Figure 4:
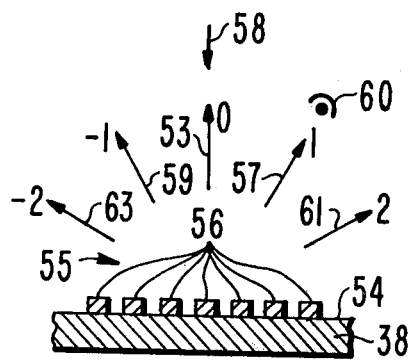
FIG. 4 is a side view of the light pattern which is projected by a diffraction grating normal to a laser beam which illuminates the diffraction grating.

Referring now to FIG. 4, a cross section of a portion of the substrate 38 is shown. On the upper surface 54 of the substrate 38 a portion of a diffraction pattern comprised of diffraction grating 55 is shown. By way of example, the grating 55 may be comprised of defined lines of photoresist 56 over the surface 54 of the substrate 38, which may be made of silicon. A laser beam (represented schematically by a downward pointing arrow 58) illuminates the surface 54 of the wafer 38 as well as the diffraction pattern 55 comprised of the photoresist lines 56. A light pattern whose rays are called "orders" is produced by the reflection of the laser beam 58 from the surface 54 with the specific light pattern being a function of the periodicity of the grating 55. In particular, there will be a zero order beam 53 which is produced normal to the surface 54, a first order beam 57 and a negative first order beam 59 produced at a first angle to the zero order beam, a second order beam 61 and a negative second order beam 63 produced at a second angle to the zero order beam, and so on. The position of any of the beams is determined by the periodicity of the diffraction pattern 55. Accordingly, a photodiode 60 may be placed in a location corresponding to where the first order beam 57 is produced in order to measure the intensity of the first order beam. The intensity of higher order beams will be related to the intensity of the first order beam, so it is sufficient for the purpose of this invention to measure the intensity of any desired beam. Accordingly, the invention will be described with reference hereinafter to the measurement of the intensity of the first order beam. However, one skilled in the art will recognize that a higher order beam or a negative order beam may be used without departing from the spirit or scope of the invention.

Figure 5:
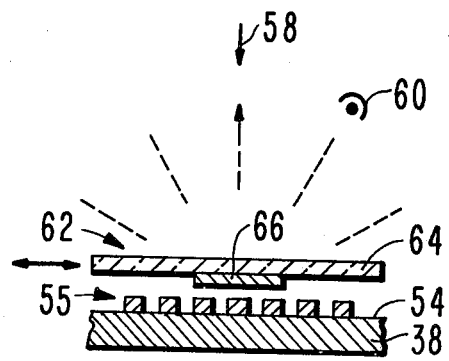
FIG. 5 is a side view of the diffraction grating of FIG. 4 further including a portion of a photomask containing an alignment key.

Referring now to FIG. 5, the diffraction pattern 55 of FIG. 4 is shown in use with a key 62 comprising a transparent substrate 64 having an opaque layer 66 thereon. The key 62 may be moved laterally with respect to the surface 54, and as the key 62 is moved, the intensity of the first order beam measured by the photodiode 60 will vary.

Figure 6:
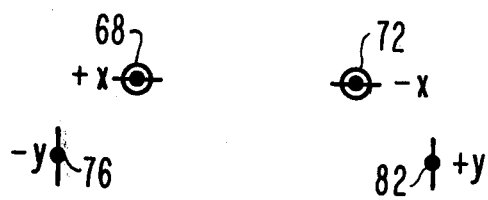
FIG. 6 is the light pattern which would be seen in a plane parallel to the plane of the diffraction pattern shown in FIG. 2 if that diffraction pattern was illuminated by a laser.

Referring now to FIG. 6, the light pattern of the first order beams which appear in a plane parallel to and result from the diffraction pattern shown in FIG. 2 is shown. There are two light spots 68, 70 corresponding to the first order beams diffracted from grating 46 of pattern 42 of FIG. 2, two light spots 72, 74 corresponding to the first order beams diffracted from grating 50, two light spots 76, 78 corresponding to the first order means diffracted from grating 48, and two light spots 80, 82 corresponding to the first order beams diffracted from grating 44. The intensity of illumination of either of the spots 68, 70 will be the same at any time as will be the intensity of illumination of any other pair of spots which arise from the diffraction from any given grating 42, 44, 46, 48. When the key 52 shown in FIG. 3 is centrally located over the diffraction pattern 42 of FIG. 2, the intensity of illumination of either of the spots 68, 70 will be equal to the intensity of illumination of either of the spots 72, 74. Similarly, the intensity of illumination of either of the spots 76, 78 will be equivalent to the intensity of illumination of either of the spots 80, 82. The intensity of illumination of either of the spots 68, 70 will decrease as the key 52 is moved over the pattern 42 in the +x direction. Therefore, those spots 68, 70 will be referred to as the "+x" spots. Similarly, the spots 72, 74 will be referred to as the "−x" spots, the spots 76, 78 will be referred to as the "+y" spots, and the spots 80, 82 will be referred to as the "−y" spots. Accordingly, the intensity of illumination of either of the +x spots 68, 70 can be compared to the intensity of illumination of either of the −x spots 72, 74 in order to determine whether the key 52 is properly aligned over the diffraction pattern 42 with respect to movement along the x-axis. In the preferred embodiment of the invention, the comparision of the intensity of illumination is made by placing photodiodes 30 in the locations corresponding to the +x spot 68 and the −x spot 72 (shown circled in FIG. 6). Similarly, photodiodes 30 are placed at the location of the +y spot 80 and the −y spot 78 in order to measure their relative intensities to determine the alignment of the key 52 with respect to the y-axis of the pattern 42. While a particular group of four spots was selected to provide x and y information in the preferred embodiment of the invention, it should be obvious to one skilled in the art that any other selection which includes at least one +x spot, at least one −x spot, at least one +y spot and at least one −y spot would provide equivalent information.

Figure 7:
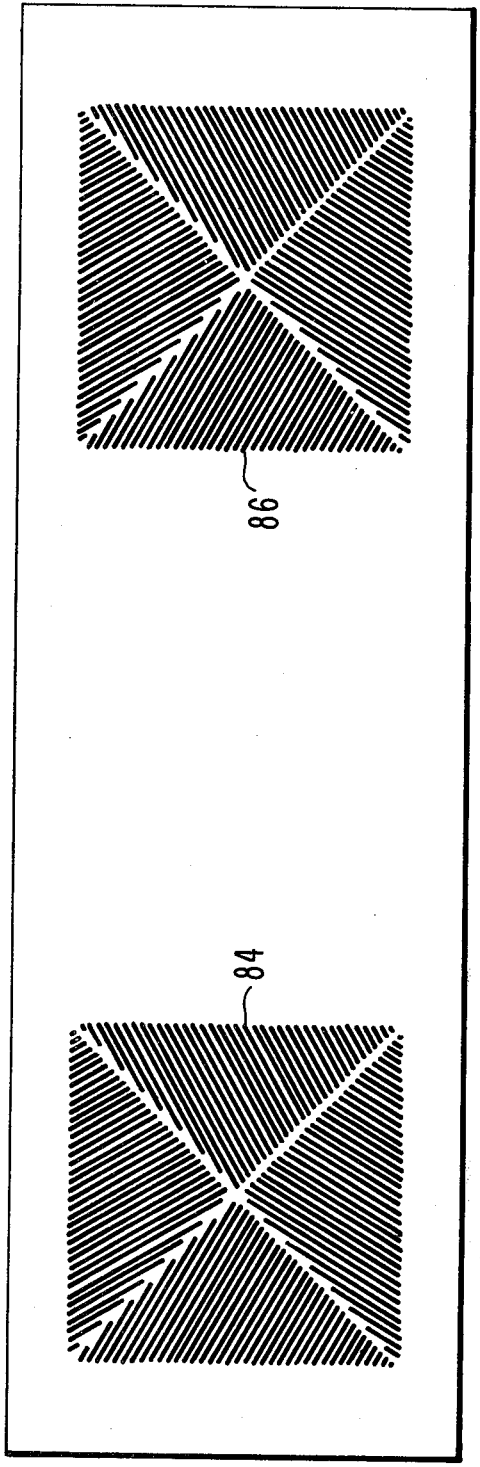
FIG. 7 is a top view of a diffraction pattern which includes two patterns of the type shown in FIG. 2 which allows it to provide rotational as well as x-axis and y-axis information.
Figure 8:
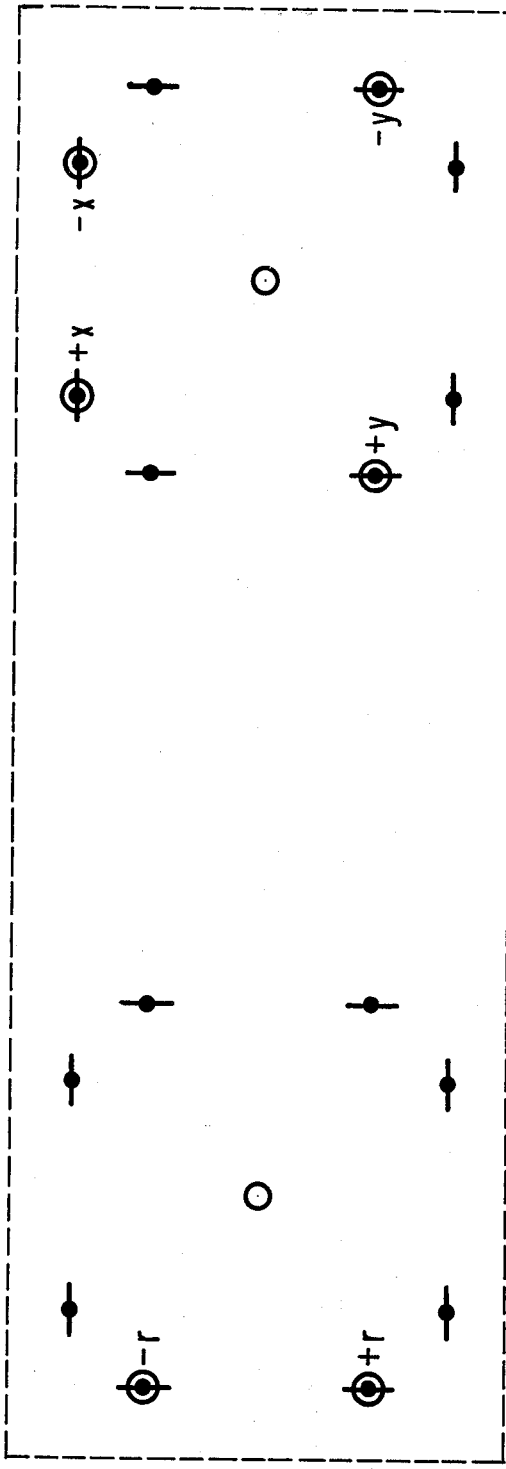
FIG. 8 is the light pattern projected by the diffraction pattern shown in FIG. 7 in a plane normal to the diffraction pattern of FIG. 7 when that pattern is illuminated by a laser.

While a single diffraction pattern 42 and a single key 52 are sufficient to determine whether the key 52 is centrally located over the diffraction pattern 42, a single pattern 42 and key 52 are insufficient to determine whether there has been any rotation of the key 52 with respect to the diffraction pattern 42. In view of the fact that such rotational information is critical to the proper alignment of a photomask with a semiconductor substrate in the manufacture of semiconductor devices, the actual diffraction pattern 85, shown in FIG. 7, utilized in the preferred embodiment of the invention includes two diffraction patterns 84, 86 which are displaced from one another as shown. The light pattern which results when a laser illuminates the diffraction pattern 85 through a pair of spaced keys 52 of the type shown in FIG. 3 which have a center-to-center spacing equivalent to the center-to-center spacing of the diffraction patterns 84, 86 is shown in FIG. 8.

In order to provide rotational information in addition to the translational (x-y) information, the preferred embodiment of the invention compares the illumination of one of the +y spots and one of the −y spots from the second diffraction pattern in addition to the translational information previously discussed with reference to FIG. 6. In view of the fact that the +y and −y information derived from the second diffraction pattern is used solely for rotational purposes, it is called +r and −r information. As will be understood by one of ordinary skill in the art the +y and −y spots of the second pattern are used to obtain rotational information when the diffraction patterns are aligned along the x-axis in order to obtain the maximum sensitivity available. However, other choices could be made. As shown in FIG. 8, if six photodiodes 30 are used to compare the relative intensities of +x and −x, +y and −y and +r and −r spots all of the information required for alignment is provided. As will be understood by one of ordinary skill in the art, any six equivalently disposed spots may be used to obtain the necessary information.

Figure 9:
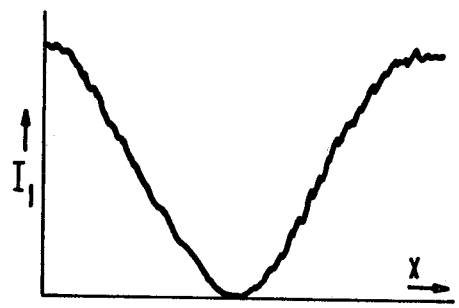
FIG. 9 is a graph of the difference in intensities of light projected onto two given spots, such as $+x$ and $-x$, versus displacement of the photomask key over a diffraction grating along the x-axis.

Referring now to FIG. 9, a graph of the absolute value of the difference in intensity of illumination of a +x and a −x spot is shown as a key 52 is moved along the x-axis relative to the wafer 38 having a diffraction pattern thereon. As shown in FIG. 9, the intensity plot includes a number of perturbations which result from Fabry-Perrot resonance.

Figure 10:
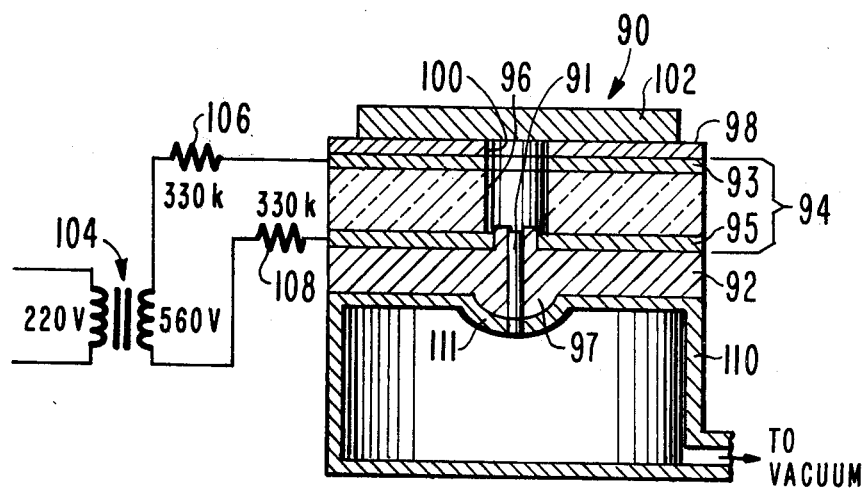
FIG. 10 is a sectional and schematic view of a vibrating wafer holder used to eliminate the fluctuations in intensity shown in FIG. 9 which are caused by Fabry-Perrot resonance.

The inventors have found that Fabry-Perrot resonance, which results from reflection of light between the photomask and diffraction pattern which do not move in perfectly parallel planes, can be substantially eliminated by utilizing the apparatus 90 shown in FIG. 10 which comprises a vacuum chuck 92 and a cylindrical piezoelectric element 94, which is comprised of four layers of PZT material in the preferred embodiment of the invention, and which has silver contact layers 93, 95 on the upper and lower surfaces, respectively. The piezoelectric element 94 has a central hole 96 therein which aligns with a central hole 91 formed in the vacuum chuck 92. A metal disc 98 having a central hole 100 therein lies over the surface of the piezoelectric element 94 with the central holes 100, 96, 91 aligned. The purpose of the metal disc 98 is to provide surface matching between a semiconductor substrate 102 and the upper silver layer 93 of the piezoelectric element 94. Accordingly, when vacuum is present in a vacuum chamber 110 the substrate 102 will be held securely in place.

An alternating voltage is established across the piezoelectric element 94 by a circuit comprising a transformer 104 and a pair of resistors 106, 108 which each have a value of 330,000 ohms in the preferred embodiment of the invention. The transformer 104 is used to provide an alternating output voltage of 560 volts from a 220 volt a.c. source, which is adequate to vibrate the piezoelectric element 94 with the substrate 102 on it by about one order of optical interference, i.e. about 1-2 micrometers.

In operation, the apparatus 90 and the substrate 102 are brought into light contact with a photomask in order to place the wafer 102 and photomask in parallel planes before sufficient vacuum is applied to lock the elements of the system 90 in position. To assist such action, the vacuum chuck 92 has a hemispherical male portion 97 which matches a similar hemispherical female portion 111 in the vacuum chamber 110. The hemispherical portions 97, 111 allow for relative movement between the wafer 102 and the photomask (not shown) in order that the wafer 102 can be brought into planar relationship with the photomask. Thereafter, vacuum sufficient to fix the elements of apparatus 90 in position, is applied.

In the preferred embodiment of the invention, the piezoelectric element 94 comprises a disc having a diameter of 37 mm, a thickness of 6 mm and a center hole with a diameter of 12 mm. The element 94 is comprised of PZT material manufactured by Vernitron in Bedford, Ohio.

Figure 11:
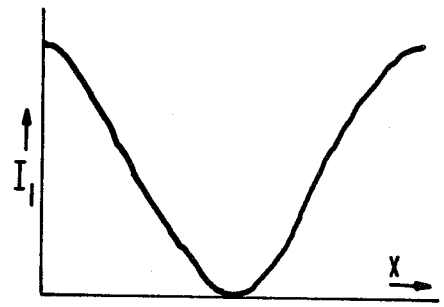
FIG. 11 is a graph of the difference in intensities of light projected onto two given spots such as $+x$ and $-x$ versus displacement of the photomask key over a diffraction grating along the x-axis when using the apparatus shown in FIG. 10.

The element 94 will vibrate the wafer 102 at a frequency of 60 Hz when standard U.S. a.c. is used. Obviously, if this device is in an area where a.c. has a frequency other than 60 Hz, the element 94 oscillates at a frequency other than 60 Hz. For example in Europe, where the standard a.c. has a frequency of 50 Hz, the element 94 vibrates at 50 Hz. As long as the frequency of vibration is at least an order of magnitude below the lower of the resonance frequency, which is about 10 KHz, and the chopping rate, which is about 1600 Hz, the Fabry-Perrot resonance will be substantially eliminated. In view of the fact that the semiconductor substrate 102 also vibrates when element 94 vibrates, and the fact the average light received by the photodiodes 30 is sampled periodically, the Fabry-Perrot effects are eliminated and the intensity curve shown in FIG. 9 will have the perturbations removed, as shown in FIG. 11.

As an alternative to the embodiment shown in FIG. 10, a solid piezoelectric element can be used which has affixed to its upper surface a box adapted to receive a vacuum which has a plurality of holes on its upper surface. The box would be used for holding the substrate to the combined box and piezoelectric element through the use of a first vacuum line and a second vacuum line would be used for holding the composite box and piezoelectric element to a vacuum chuck of the type shown in FIG. 10. In that manner the substrate could be held to the composite with vacuum while the whole structure is aligned with a photomask.

Figure 12:
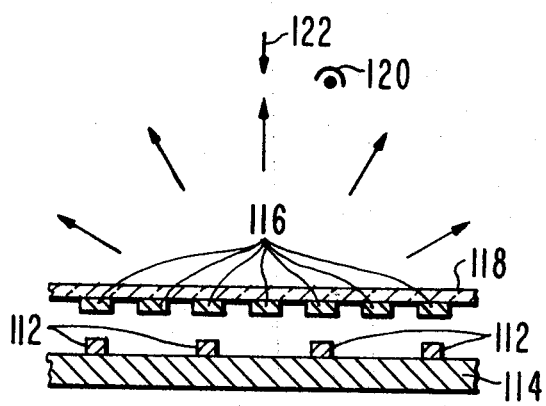
FIGS. 12 and 13 show an apparatus for achieving fine alignment when the present invention is employed.
Figure 13:
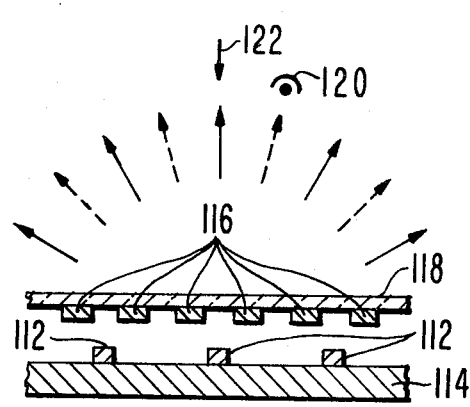

Referring now to FIGS. 12 and 13, a fine alignment system is shown which includes a diffraction grating 112 on the surface of a wafer 114. Instead of a completely opaque key, a key comprising a series of spaced opaque lines 116 having a periodocity twice that of the periodicity of the diffraction grating 112 is employed on a transparent substrate 118. When a laser beam 122 is transmitted through the key 116 onto the diffraction grating 112 a series of orders corresponding to the spacing of the lines and the key 116 will be produced when the key 116 is aligned over the grating lines 112. However, when the key 116 is not properly aligned over the diffraction grating 112, as shown in FIG. 13, the number of orders produced will change because the effective periodicity of the key 116 changes by the fact that the diffraction grating 112 is aligned with the spaces between the lines of the key 116. Accordingly, a photosensitive element, such as a photodiode 120 can be used to sense the presence or absence of light which will determine whether the key 116 and diffraction gratings are properly aligned. As will be understood by those skilled in the art, a number of gratings adequate to provide x, y and rotational information will be needed when the alignment system is employed. However, for clarity, only a single diffraction grating 112 and key 116 are shown in FIGS. 12 and 13.

It has been found by the inventors that the utilization of a fine alignment system described with reference to FIGS. 12 and 13 is not yet necessary with the present state of photolithographic technology and semiconductor device manufacture. However, such a system can be used where finer degrees of tolerance are required than are available using the system heretofore described.

As will be recognized by those having skill in the art, the diffraction pattern can be formed on the substrate in many ways. For example, the diffraction pattern may take the form of defined and developed photoresist lines, etched silicon dioxide lines, etched silicon nitride lines, or a metallization pattern, to mention a few methods of forming the diffraction pattern without providing an exclusive listing of such ways. A particular advantage of the invention is that a material which makes up the diffraction pattern may be different in different steps in the process of manufacturing semiconductor devices and may be different in portions of the same step in the manufacture of the semiconductor devices. For example, a photomask may be aligned with a substrate using a silicon dioxide pattern formed on the substrate over which a photoresist layer has been applied. If that photomask is used to define another pattern in the photoresist layer, the photoresist may then be developed to provide the desired photoresist pattern as well as a diffraction pattern in the photoresist layer. Then, before that defined and developed photoresist pattern is used for etching, the diffraction pattern formed in the photoresist layer may be checked by the alignment system to insure that alignment was accurately placed. If the alignment was not done accurately the photoresist may be stripped, reapplied, defined and developed before any etching is performed. Thus, an advantage of the present invention is that alignments may be checked before the patterns are used for etching purposes.

Another advantage of the present invention is that the periodicity of a diffraction pattern determines the pattern of diffracted light. Accordingly, if a diffraction pattern is made of a material such as silicon dioxide which is subject to etching, differences in line width and spacing will not affect future alignments, because the periodicity of the lines will remain the same notwithstanding the line width and spaces between lines may vary. These and other advantages of the present invention will be obvious to those having skill in the art.

While the present invention has been discussed with reference to first order diffracted beams, one of ordinary skill in the art would recognize that the intensity of beams of other orders is related to the intensity of the first order beams. Accordingly, the intensity of beams of different orders can be compared in order to provide alignment in accordance with the present invention. However, where the intensity of a beam of one order is compared to the intensity of a beam of a different order, a weighting function will have to be utilized, as will be obvious.

In order to simplify the preferred embodiment of the invention, beams of only the first order have been discussed herein. Those skilled in the art will recognize that numerous permutations of the specific system described including alterations in beam orders, the size or shape of the key, the specific layout of the diffraction pattern, or the choice of beams would not deviate from the spirit or scope of the invention.

What is claimed is:

1. An automatic apparatus for aligning a photomask with a substrate comprising:
   (a) a substrate having a diffraction pattern formed thereon;
   (b) a monochromatic light source adapted to have a beam directed onto said diffraction pattern;
   (c) a completely opaque key on the photomask, said completely opaque key being adapted to block portions of said diffraction pattern from the beam of said monochromatic light source;
   (d) at least two photosensitive elements adapted to receive light from said monochromatic light source after it has been reflected from said diffraction pattern;
   (e) mounting means for mounting said substrate and said photomask such that the photomask and substrate can be moved relative to one another; and
   (f) a feedback mechanism including said photosensitive elements and said mounting means for aligning said photomask to said substrate by relative movement between said photomask and said substrate in response to the intensities of light detected by said photosensitive elements.

2. The apparatus of claim 1 wherein said monochromatic light source comprises a laser.

3. The apparatus of claim 1 wherein said diffraction pattern is comprised of a photoresist pattern formed on a semiconductor substrate.

4. The apparatus of claim 1 wherein said substrate comprises a silicon wafer and said diffraction pattern is comprised of a silicon dioxide pattern formed on said substrate.

5. The apparatus of claim 1 wherein said diffraction pattern comprises a series of diffraction gratings which provide x-axis, y-axis and rotational information regarding the relative alignment of said photomask and said substrate.

6. The apparatus of claim 1 wherein said photosensitive elements comprise photodiodes.

7. The apparatus of claim 1 wherein said mounting means comprises a movable stage.

8. The apparatus of claim 7 wherein said photomask mounts on said stage.

9. The apparatus of claim 7 wherein said substrate mounts on said stage.

10. A method of automatically aligning a photomask with a substrate comprising the steps of:
    (a) transmitting a monochromatic beam onto a diffraction pattern on said substrate;
    (b) blocking a portion of said monchromatic beam from reaching said diffraction pattern by a completely opaque key on said photomask;
    (c) measuring the intensity of beams of light reflected from said diffraction pattern; and
    (d) moving said photomask relative to said substrate in order to match the intensities of desired beams.

11. The method of claim 10 wherein said step of transmitting a monochromatic beam comprises the step of transmitting a beam from a laser.

12. The method of claim 11 further comprising chopping said beam before it is transmitted through said key.

13. The method of claim 12 further comprising splitting said beam into two beams before it is transmitted through said key.

14. The method of claim 13 further comprising measuring the intensity of beams of light reflected from at least two of said diffraction patterns, which reflected beams are representative of the displacement of the key with respect to each of said diffraction patterns along the x-axis and y-axis, whereby the intensities of the reflected beams are representative of the rotation of the key with respect to said diffraction patterns.

15. The method of claim 14 further comprising moving said photomask relative to said substrate in response to signals determined by the intensities of said beams.

16. The method of claim 14 further comprising moving said substrate relative to said photomask in response to signals determined by the intensities of said beams.

17. An automatic apparatus for aligning a photomask with a substrate comprising:
   (a) a substrate having a diffraction pattern formed thereon;
   (b) a monochromatic light source adapted to have a beam directed onto said diffraction pattern;
   (c) an opaque key on the photomask, said opaque key being adapted to block portions of said diffraction pattern from the beam of said monochromatic light source;
   (d) at least two photosensitive elements adapted to receive light from said monochromatic light source after it has been reflected from said diffraction pattern;
   (e) mounting means for mounting said substrate and said photomask such that the photomask and substrate can be moved relative to one another;
   (f) a feedback mechanism including said photosensitive elements and said mounting means for aligning said photomask to said substrate by relative movement between said photomask and said substrate in response to the intensities of light detected by said photosensitive elements; and
   (g) means for vibrating said substrate in a direction substantially perpendicular to the planes of said substrate and said photomask.

18. The apparatus of claim 17 wherein said means for vibrating comprises a piezoelectric element on which said substrate is mounted.

19. The apparatus of claim 18 wherein said piezoelectric element is a PZT element and said apparatus further comprises means for providing an alternating voltage across said piezoelectric element.

20. The apparatus of claim 17 wherein said photosensitive elements comprise photodiodes.

21. The apparatus of claim 17 wherein said mounting means comprises a movable stage.

22. The apparatus of claim 21 wherein said photomask mounts on said stage.

23. The apparatus of claim 21 wherein said substrate mounts on said stage.